United States Patent [19]

Bornstein et al.

[11] Patent Number: 4,539,625
[45] Date of Patent: Sep. 3, 1985

[54] LIGHTING SYSTEM COMBINING DAYLIGHT CONCENTRATORS AND AN ARTIFICIAL SOURCE

[75] Inventors: Jonathan G. Bornstein, Miami, Fla.; Peter S. Friedman, Toledo, Ohio

[73] Assignee: dhr, Incorporated, McLean, Va.

[21] Appl. No.: 636,242

[22] Filed: Jul. 31, 1984

[51] Int. Cl.³ .............................................. F21V 7/04
[52] U.S. Cl. .................................... 362/32; 362/20; 362/31; 362/84; 362/145; 362/264; 362/276; 362/307; 362/308; 362/309; 362/339; 362/340; 362/254; 362/373
[58] Field of Search ................. 362/145, 276, 32, 147, 362/209, 251, 266, 20, 31, 84, 264, 307, 308, 309, 339, 340, 254, 373

[56] References Cited

U.S. PATENT DOCUMENTS

| | | | |
|---|---|---|---|
| 3,336,472 | 8/1967 | Steinig | 362/20 |
| 4,039,816 | 8/1977 | Gareis | 240/10 R |
| 4,152,752 | 5/1979 | Niemi | 362/32 |
| 4,246,477 | 1/1981 | Latter | 362/276 |
| 4,260,220 | 4/1981 | Whitehead | 350/96.28 |
| 4,329,535 | 5/1982 | Rapp | 136/259 |
| 4,410,930 | 10/1983 | Yachabach | 362/276 |
| 4,411,490 | 10/1983 | Daniel | 350/96.10 |
| 4,422,719 | 12/1983 | Orcutt | 350/96.30 |
| 4,428,031 | 1/1984 | Mori | 362/32 |
| 4,441,143 | 4/1984 | Richardson, Jr. | 362/276 |
| 4,461,974 | 7/1984 | Chiu | 362/20 |

Primary Examiner—Stephen J. Lechert, Jr.
Assistant Examiner—Howard J. Locker
Attorney, Agent, or Firm—Joseph Scafetta, Jr.

[57] ABSTRACT

A combined lighting system for a building interior includes a stack of luminescent solar concentrators (LSC), an optical conduit made of preferably optical fibers for transmitting daylight from the LSC stack, a collimating lens set at an angle, a fixture for receiving the daylight at one end and for distributing the daylight as illumination inside the building, an artificial light source at the other end of the fixture for directing artificial light into the fixture for distribution as illumination inside the building, an automatic dimmer/brightener for the artificial light source, and a daylight sensor positioned near to the LSC stack for controlling the automatic dimmer/brightener in response to the daylight sensed. The system also has a reflector positioned behind the artificial light source and a fan for exhausting heated air out of the fixture during summer and for forcing heated air into the fixture for passage into the building interior during winter.

16 Claims, 4 Drawing Figures

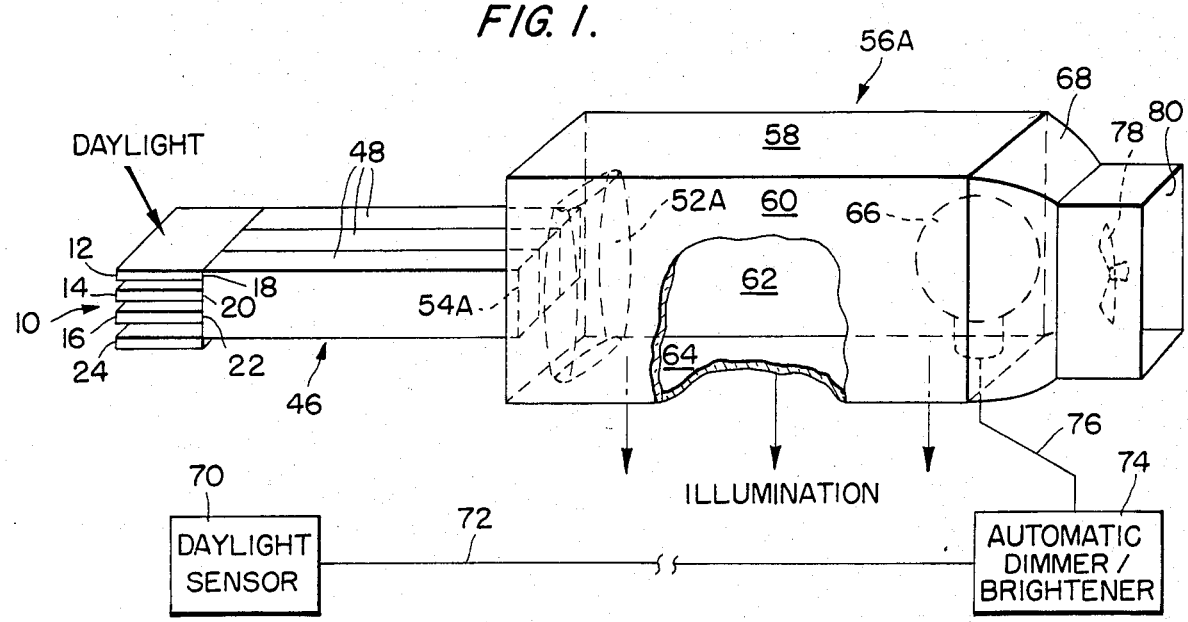
FIG. 1.
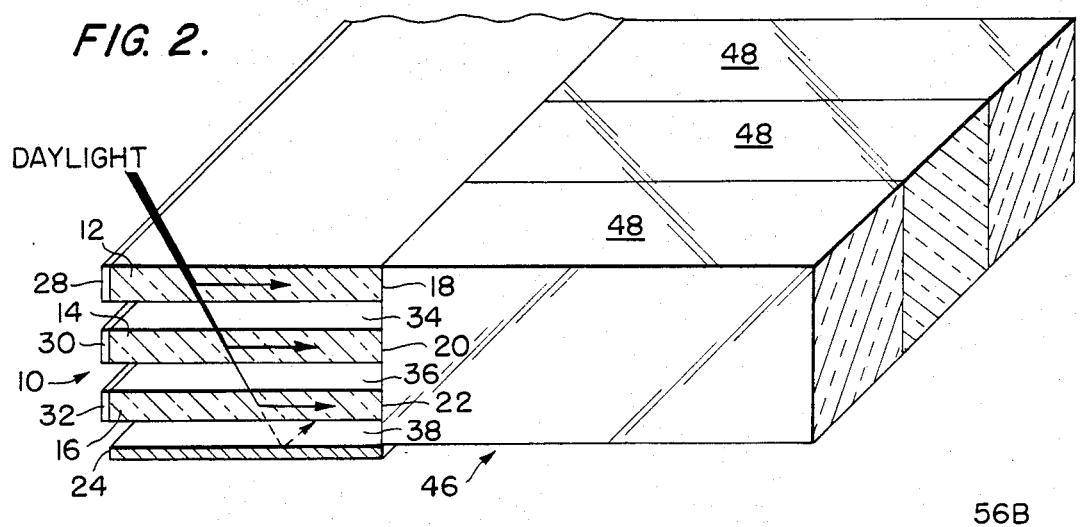
FIG. 2.
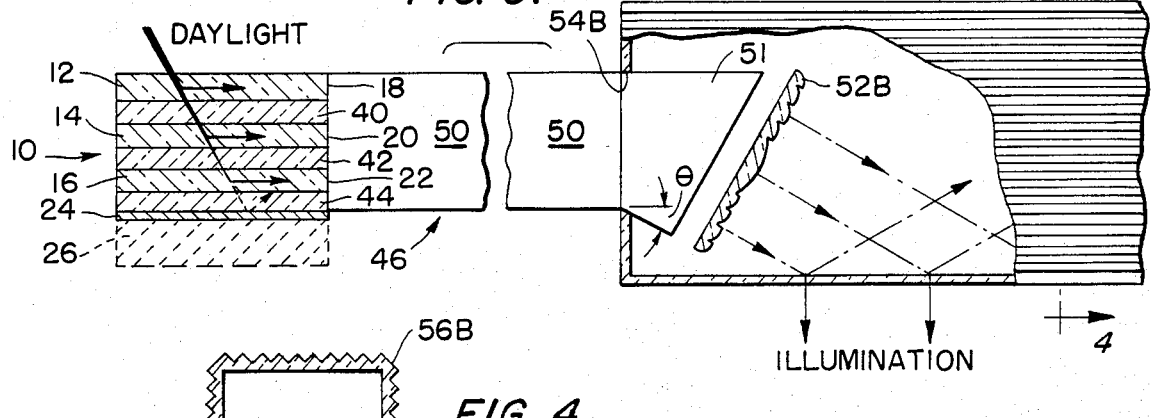
FIG. 3.
FIG. 4.

LIGHTING SYSTEM COMBINING DAYLIGHT CONCENTRATORS AND AN ARTIFICIAL SOURCE

BACKGROUND OF THE INVENTION

1. Field of the Invention

This invention concerns a complete lighting unit, also called aluminaire, that combines a natural daylighting source for white light formed by luminescent solar concentrators and an artificial source having an automatic dimming/brightening capability in response to the presence of daylight.

2. Description of the Prior Art

The use of daylight for interior building illumination has in recent years been explored by innovators in lighting design and technology. A variety of concepts are being pursued that show some promise for introducing reasonable levels of daylight into a building for general illumination.

Many of the collector designs are based on configurations that require mechanical tracking of the sun by heliostats or rotating Fresnel lenses, for example. Still other concepts that do not require tracking have been described. These concepts include: diffractive optics, i.e. holographic optical elements; and reflective cylinders. The obvious advantage of nontracking collectors over those that must track the sun is the elimination of moving parts. In either case, however, the principal function is the collection of direct solar rays and this process requires, in almost all cases, focusing on the sun itself. Some examples of recently known prior art lighting systems follow.

U.S. Pat. No. 4,039,816, issued to Gareis in 1977, discloses an arrangement for transmitting light energy from a light source through a stack of light-conducting members. Each member collects a different portion of the light energy illuminated from the light source and guides its portion along a prescribed path to its reflecting surface which then reflects the light energy through a Fresnel lens.

U.S. Pat. No. 4,152,752, issued to Niemi in 1979, discloses an illumination system for a building in which light pipes distribute light from both artificial and natural light sources. Sunlight is received directly by a conventional stationary solar collector/concentrator and is directed by light pipes to light fixtures. An artificial light source is disposed within a housing having a suitable reflector, such as a parabolic type, for directing high intensity light through the light pipe to a splitter which combines it with light from the natural source. The artificial light source may be a high intensity lamp, such as a mercury vapor lamp or the like. A dimmer switch is also provided for the light fixture.

U.S. Pat. No. 4,411,490, issued to Daniel in 1983, shows an apparatus for collecting solar radiation as a single beam through a lens system which provides a coherent light beam to a light pipe. The distribution system may employ a Fresnel lens as the light fixture which is mounted in a ceiling panel of the building.

U.S. Pat. No. 4,422,719, issued to Orcutt in 1983, discloses a light distribution system including a light guide having a square cross section.

U.S. Pat. No. 4,428,031, issued to Mori in 1984, discloses an illumination device for directing sunlight into the interior of a room after passing through a Fresnel lens. The light source is the sun and the rays emanating from the sun are carried by an optical wave guide which may be a bundle of optical fibers.

Thus, it may be seen that, in the known prior art devices, there is not a system combining luminescent solar concentrators (LSC) and an artificial source having an automatic dimmer/brightener responsive to a daylight sensor.

U.S. Pat. No. 4,329,535, issued to Rapp in 1982, discloses a thin film LSC capable of efficiently concentrating both the diffuse and direct components of sunlight at all angles of incidence while remaining completely stationary. The only known prior use of such LSC has related to their use in photovoltaic cells.

U.S. Pat. No. 4,260,220, issued to Whitehead in 1981, discloses a prism light guide that may serve as a distributor for efficiently propagating light. However, the nature of the light sources used with the distributive light guide is not disclosed.

Therefore, for all practical purposes, there is not a highly efficient lighting system for bringing daylight deep within the interior of a building because, presently, interior daylighting is substantially restricted to the perimeter and near perimeter locations, i.e. space situated close to apertures, such as windows and skylights, in buildings.

SUMMARY OF THE INVENTION

The combined lighting system of the present invention for the interior of a building operates by light collection and wavelength conversion of incident daylight by external stationary luminescent solar concentrators that subsequently channel light into the building via a conduit of planar or fiber optics to optical collimators which project this light through a prism light guide/distributor at a proper angle for propagation. The daylight component of the system can result in efficient white light illumination completely by itself inside a building even though the system also integrally incorporates an interior stationary artificial source of very high luminous efficacy that provides for equalization and maintenance of a constant luminance level by a daylight sensor coupled to an automatic dimmer/brightener unit.

It is, therefore, a primary object of this invention to provide a complete lighting unit that efficiently combines the output of LSCs and an artificial source having a direct compensatory dimming/brightening control unit in response to variable daylight or dark/nighttime conditions.

It is a further object of this invention to use a distribution fixture, e.g. a prism light guide, as a conduit for seasonal distribution of forced air flowing therethrough. During the cold seasons, air is forced over the artificial light source and directed through the prism light guide in order to radiate heat into rooms in a building. During the warm season, the air is forced in the opposite direction so that heat generated by the high intensity artificial light source is exhausted to the atmosphere outside the building.

The combined system of the present invention, using both daylight and an artificial source, is more energy efficient than conventional fluorescent tube lighting. Furthermore, the ability to reduce air conditioning cooling loads in summer and the ability to use heat generated by the artificial source in winter contributes to a very high potential cost-effectiveness for this combined system.

Another advantage of this combined lighting system, albeit of little importance on a daily basis, is that, in the event of an electrical power failure, the interior of the building would not be plunged, during daytime hours, into total darkness because the daylight component of this combined system would still function even though the artificial component would be inoperative.

This and other advantages accomplished by the present invention will become clear from the following description of the embodiments of the invention.

BRIEF DESCRIPTION OF THE DRAWINGS

FIG. 1 is a schematic perspective view of a first embodiment of the invention.

FIG. 2 is an enlarged schematic perspective view of the left hand side of the first embodiment.

FIG. 3 is a broken away schematic side elevational view of a second embodiment of the invention.

FIG. 4 is a cross-sectional view of the prism light guide of the second embodiment taken along line 4—4 of FIG. 3.

DETAILED DESCRIPTION OF THE PREFERRED EMBODIMENTS

From the point of view of efficiently capturing both the diffuse and direct components of daylight, a stack 10 of luminescent solar concentrators (LSC), shown in FIGS. 1-3, is selected. The LSC stack 10 uses a fluorescent dye contained in or on a plurality of transparent plates 12, 14, and 16. Light incident on the LSC stack 10 induces fluorescence which is largely trapped within the plates 12, 14, and 16 by total internal reflection and eventually is emitted at the edges 18, 20, and 22 of each plate 12, 14, and 16, respectively. Preferably, for white light production, the LSC stack 10 should be a three color stack. Although the LSC stack 10 is shown in FIG. 1 to be square in shape, it may be rectangular as shown in FIG. 2, triangular, or any other suitable shape. In most cases, the top plate 12 emits only blue light through its edge 18; the middle plate 14, red light through its edge 20; and the bottom plate 16, green light through its edge 22.

Although only a stack of three differently colored plates are shown, a single colored plate, two differently colored plates, or a plurality of plates of the same color may be used, depending upon the color of the light desired to be absorbed and emitted. A discussion of the last-mentioned example will be made hereinafter.

The plates 12, 14, and 16 are arranged in a three color stack in order to maximize energy transfer efficiency and minimize light leakage. Specifically, the ultraviolet (UV)-blue absorbing LSC plate 12, having the shortest wavelength absorption and emission spectra, is situated on top of the LSC stack 10 because it intercepts the maximum amount of UV radiation available to it in daylight and also protects the fluorescent dyes beneath it from UV degradation. The red light emitting LSC plate 14 is situated between the blue plate 12 and the green plate 16 to act essentially as a light trap for the approximately 12.5 percent non-internally reflected photons that are lost from the top of the green LSC plate 16. Photons lost from the bottom of the blue plate 12 can also be trapped by either the red plate 14 or the green plate 16. Since the absorption spectra of red and green fluorescent plates 14 and 16, respectively, do not appreciably overlap, the daylight absorbed by the red plate 14 only negligibly affects optimum light absorption by the green plate 16.

As shown in FIGS. 1-3, a bottom reflector 24 may be placed below the green plate 16 in order to reflect any lost or transmitted light back into the LSC stack 10. As shown only in the second embodiment of FIG. 3, a substrate 26 supports the bottom reflector 24.

Also as shown only in FIG. 2, side reflectors 28, 30, and 32 may also be placed along all uncoupled edges of the plates 12, 14, and 16 but are shown only opposite to edges 18, 20, and 22, respectively. The reflector 24, shown in FIGS. 1-3 and the side reflectors 28, 30, and 32, shown only in FIG. 2, may be made of solid opaque aluminized mylar. The side reflectors 28, 30, and 32 may be strips, as shown in FIG. 2, or a solid sheet (not shown). Optionally, as shown in FIG. 3, the side reflectors 28, 30, and 32 may be omitted.

Another difference in the LSC stack 10 between the first embodiment of FIG. 2 and the second embodiment of FIG. 3 is that the first embodiment in FIG. 2 has air gaps 34, 36, and 38 beneath each of the plates 18, 20, and 22, whereas the second embodiment in FIG. 3 has transparent plates 40, 42, and 44 beneath each of the plates 18, 20, and 22, for rendering support thereunder and for defining the space between adjacent plates.

The advantage of having the air gaps 34, 36, and 38 is that the total internal reflection is maximized. However, in practice, creating the air gaps 34, 36, and 38 is a difficult manufacturing process. Therefore, from a practical standpoint, the use of a laminar structure for the LSC stack 10 having transparent plates 40, 42, and 44 beneath the colored plates 18, 20, and 22, respectively, simplifies the polishing and aligning steps during the manufacturing process before the LSC stack 10 is coupled to an optical conduit 46. However, a difference in internal reflection efficiency exists because the air gaps 34, 36, and 38 have a refractive index of 1.0 while the lower limit for the solid transparent plates 40, 42, and 44 is about 1.4.

Once the daylight has been absorbed and internally reflected to the side edges 18, 20, and 22 of the plates 12, 14, and 16, the daylight is transmitted to an optical conduit 46 shown in FIGS. 1-3. Preferably, the optical conduit 46 is a transmitting optical element or, as shown in the first embodiment of FIGS. 1 and 2, a plurality of bundled optical fibers 48, each having a square cross-section and each being coupled at their entrance end to the side edges 18, 20, and 22 which function as exit ends for the LSC plates 12, 14, and 16. Optical fibers 48 of square cross-section allow the maximization of surface area utilization even though fiber misalignment and packing fracture losses will still, to some extent, interfere with ideal coupling efficiency.

From a practical standpoint, a significant advantage proffered by the optical fibers 48, especially those made of plastic as shown in the first embodiment of FIG. 2, is their flexibility which allows them to move light from one point to another along a non-linear path. Indeed, from a building design point of view, working with flexible optical fibers 48 would alleviate certain design restrictions. However, optical fibers 48 are expensive and, in fact, because of their inherent flexibility, they are very small and individually cover very little surface area, thereby causing some losses of daylight at the interface of the optical fibers 48 with the side edges 18, 20, and 22 of the LSC stack 10.

Alternatively, as illustrated schematically in the second embodiment of FIG. 3, the optical conduit 46 may be a molded optical plane 50, shown only in side elevation. The molded plane 50 covers a much larger surface area for coupling with the LSC stack 10 and is less expensive to manufacture than the bundle of aligned optical fibers 48 of square cross-section, best shown in FIG. 2. All three plates 12, 14, and 16 in the LSC stack 10 could, for example, be coupled with a single broad strip, ribbon, or plane 50.

Another example (not shown) might be an optical conduit 46 having a molded plane 50 coupled to the LSC stack 10 and then having a bundle of optical fibers 48 coupled to the end of the molded plane 50 for subsequent transmission of the daylight. Such a configuration would eliminate the need for coupling the individual optical fibers 48 to the LSC stack 10 but would still allow the optical conduit 46 to maintain its flexibility due to the presence of the optical fibers 48 along a substantial length of such optical conduit 46.

When light reaches the exit end of the optical conduit 46, it passes into a collimating lens 52 set at an entrance 54 to a distribution fixture 56. The collimating lens 52, which brings the light back into a parallel line, may be a convex condenser lens 52A shown in phantom lines only in the first embodiment of FIG. 1, may be a Fresnel lens 52B shown only in the second embodiment of FIG. 3, or may be another type of lens such as a holographic lens (not shown). In the second embodiment of FIG. 3, a reflective cone or conical feeder 51 may be attached to the exit end of the optical conduit 46 for directing the light at a proper angle $\theta$, to be discussed hereinafter, to the Fresnel lens 52B. The entrance 54 to the distribution fixture 56 is a plane for coupling the optical conduit 46 to the collimating lens 52. For example, as shown in the first embodiment of FIG. 1, the entrance 54A couples the maximum number of optical fibers 48 to the condenser lens 52A. Also, as shown in the second embodiment of FIG. 3, the entrance 54B couples the molded plane 50 to the feeder 51 which directs light into the Fresnel lens 52B.

Another option for the collimating lens 52, instead of the condenser lens 52A of the first embodiment or the Fresnel lens 52B of the second embodiment, is an array of lenses (not shown), Fresnel or otherwise, molded into a single unit that would directly couple with an optimum number of optical fibers 48 at the entrance 54 to the distribution fixture 56.

In the first embodiment of FIG. 1, a light pipe 56A has its top wall 58 and its opposite side walls 60 and 62 manufactured as one-way mirrors for internally reflecting substantially all light while its bottom wall 64 may be a two-way mirror for internally reflecting some light and for allowing the remainder of the light to pass therethrough as illumination.

In the second embodiment of FIG. 3, the distribution fixture 54 is a light pipe in the form of a prism light guide 56B. A cross-sectional view of this prism light guide 56B is shown in FIG. 4. This prism light guide 56B is an existing, commercially available component manufactured in accordance with U.S. Pat. No. 4,260,220, issued to Whitehead and discussed beforehand. This prism light guide 56B operates by the process of total internal reflection within multiple prisms composing the walls of a hollow tube having a square cross-section. Light rays emerging from the Fresnel lens 52B or other collimating lens 52 enter the prism light guide 56B and must fall within a maximum angle $\theta$ which is the acceptable angle for propagating light through the prism light guide 56B. This angle $\theta$ of projection for the light relative to the horizontal plane, varies with the index of refraction for the material being used in the walls of the prism light guide 56B. For example, for the preferred material of acrylic plastic, the angle $\theta$ is 27.6°. Directing the conical feeder 51 so that light enters the Fresnel lens and exits it in a parallel line at the angle $\theta$ ensures that light is propagated through as well as out of the prism light guide 56B as illumination. Practically all the light incident at the entrance 54 of the distribution fixture 56 is distributed as illumination via the escaping light rays at each reflection.

In addition to the natural source of daylight processed through the LSC stack 10 to the entrance 54 of the distribution fixture 56, an artificial light source 66 is incorporated at an end of the distribution fixture 56 opposite to the entrance 54. This artificial source 66 is shown only in phantom lines in the first embodiment of FIG. 1 but is understood to be also included in the second embodiment at the end of the prism light guide 56B shown in FIG. 3. The most efficient and economical artificial source 66 is a high intensity discharge lamp, using either a metal halide arc, mercury vapor, or sodium vapor. Such an artificial source 66, even by itself, is much more efficient than the newest energy saving fluorescent system.

Although a high pressure sodium vapor (HPS) lamp has the best luminous efficacy of any other high intensity discharge (HID) lamp, being upwards of 20 percent higher than a metal halide lamp and 120 percent higher than a mercury vapor lamp, an HPS lamp suffers from a relatively low color rendering index and a low apparent color temperature. As a result, the light output is seen as orange-yellow, which is an unpleasant color for indoor illumination, especially for work places.

To counter this perceived unpleasant color, a LSC stack 10 may be used consisting of only green color emitting plates 22 because, in combination, the chromaticity of these two sources, i.e. daylight reflected through green plates 22 and artificial orange-yellow light emitted from an HPS lamp, approach very nearly a while light effect. Furthermore, the green plates 22 have demonstrated the highest photostability relative to the other colored plates which may be used in the LSC stack 10.

In order to direct the light output from the artificial source 66, a reflector 68, shown only in the first embodiment of FIG. 1 but also intended for use in the second embodiment of FIG. 3, will be placed behind the artificial source 66 at the end of the distribution fixture 56. The reflector 68 may be a modified parabolic type but other types may also be used.

The artificial source 66 automatically compensates for fluctuations in the amount of daylight being processed by the LSC stack 10 over the course of a day due to the placement of the daylight sensor 70 adjacent to the LSC stack 10. This daylight sensor 70 responds to the presence or absence of daylight and feeds information electrically via a line 72 to an automatically responsive dimmer/brightener 74 which in turn feeds a command signal electrically via a line 76 to the artificial light source 66 so that such artificial source 66 may be adjusted in light output sufficient enough to maintain a constant illumination through the distribution fixture 56. This daylight sensor 70 and automatic dimmer/brightener 74 are incorporated in both the first and second embodiments of FIGS. 1 and 3, respectively, although they are shown only in the first embodiment of FIG. 1.

Even though the preferred forms of the artificial light source 66 have very high radiant power efficiencies, a fan 78 is preferred to maintain the artificial source at a cool operating temperature. During the summer or in a constantly warm climate, the fan 78 would exhaust the hot air to the atmosphere through a ventilation opening 80. During the winter or in a constantly cold climate, the fan 78 would blow air heated by the artificial light source 66 through the distribution fixture 56. For example the heated air would enter into rooms at selected vents (not shown) along a wall of the light pipe 56A. The fan 78 with the ventilation opening 80 is also included at the end of the prism light guide 56B of the second embodiment shown in FIG. 3.

The operation of the two embodiments will now be summarized. In the first embodiment shown in FIG. 1, daylight enters the LSC stack 10, is absorbed to induce luminescence in the colored plates 12, 14, and 16, and then is emitted out through side edges 18, 20, and 22, respectively thereof, into the optical conduit 46 which is comprised of a bundle of optical fibers 48 having square cross-sections. The light is then transmitted from one end to the other end of the optical fibers 48 and enters a distribution fixture 56 having a collimating lens 52 at the entrance thereof. As the light at the end of the optical fibers 48 passes into the distribution fixture 56 which is a light pipe 56A formed with walls 58, 60, 62, and 64 made of internally reflective mirrors, the light is brought into line by the condensor lens 52A and directed down the light pipe 56A so that the light is reflected out through the bottom two-way mirrored wall 64 as illumination into the rooms of the building in which the light pipe 56A is ducted. At the same time that daylight is being piped deep into the building from the LSC stack 10, light is also being directed from the opposite end of the light pipe 56A from an artificial source 66 having a parabolic reflector 68 behind it and having its intensity controlled by an automatic dimmer/brightener 74 which is responsive to a daylight sensor 70 adjacent to the LSC stack 10. Thus, as the amount of daylight decreases from the natural source at one end of the combined system, the amount of light from the artificial source 66 at the other end of the distribution fixture 56 increases. Therefore, a constant amount of combined light is maintained passing through the bottom wall 64 of the light pipe 56A. Heat generated by the artificial light source 66 either is exhausted through the ventilation opening 80 during summer and in hot climates or is forced through the light pipe 56A and out vents (not shown) into the rooms of the building during winter and in cold climates.

The second embodiment of FIG. 3 differs from the first embodiment of FIG. 1 only in that the optical conduit 46 is a molded plane 50 instead of a bundle of optical fibers 48, the collimating lens 52 is a Fresnel lens 52B instead of a condensor lens 52A, and the distribution fixture 56 is a prism light guide 56B instead of a light pipe 56A having walls 58, 60, 62, and 64 made of internally reflective mirrors. Also, the second embodiment uses a conical feeder 51 at the entrance 54B to direct the diffused light from the end of the molded plane 50 into the Fresnel lens 52B. Such a conical feeder 51 is not used in the first embodiment of FIG. 1.

The foregoing preferred embodiments are considered illustrative only. Numerous other modifications will readily occur to those skilled in the pertinent technologies. Consequently, the disclosed invention is not limited to the exact construction shown and described but is defined by the claims appended hereto.

We claim:

1. A combined lighting system for an interior of a building comprising:

a non-rotative stack means, composed of at least one luminescent solar concentrator (LSC), for receiving daylight;

said LSC stack means being located outside of the building, having a bottom with at least three sides, and being composed of a plurality of differently colored light absorbing plates;

an optical conduit means, having two ends and being coupled to one of the sides of the stack means, for transmitting light from the LSC stack means;

a lens means, positioned at an end of the optical conduit means, for collimating the light at a set angle;

an interior fixture means, having two ends and being coupled at one end to the optical conduit means, for receiving light at the set angle from the collimating lens means and for distributing the light as illumination into the building interior;

a source means, positioned at an opposite end of the fixture means, for directing artificial light into the fixture means for distribution as illumination into the building interior;

an automatic means, connected to the artificial light source means, for dimming and brightening the artificial light distributed as illumination;

daylight sensor means, positioned outside the building near to the LSC stack means, for controlling the automatic dimming and brightening means in response to the daylight sensed;

means, positioned behind the artificial light source means, for reflecting the artificial light back into the fixture means;

reversible fan means, positioned behind the reflecting means, for exhausting heated air from the artificial light source means through the optical conduit means and out of the fixture means during summer and in warm climates and for forcing the heated air from the artificial light source means through the optical conduit means and into the fixture means for passage into the building interior during winter and in cold climates; and ventilation opening means, positioned behind the fan means, for exhausting heated air from the artificial light source means through the optical conduit means and out of the fixture means during summer and in warm climates.

2. The lighting system, according to claim 1, wherein: said plates absorb blue, red and green light.

3. The lighting system, according to claim 1, further comprising:
means, attached to at least one of the sides of the LSC stack means, for reflecting the light back inside the LSC stack means.

4. The lighting system, according to claim 1, further comprising:
means, attached to the bottom of the LSC stack means, for reflecting the light back inside the at least one LSC.

5. The lighting system, according to claim 1, wherein: said optical conduit means is a plurality of aligned and bundled optical fibers.

6. The lighting system, according to claim 5, wherein: said optical fibers have square cross-sections.

7. The lighting system, according to claim 1, wherein: said optical conduit means is a molded optical plane.

8. The lighting system, according to claim 1, wherein: said collimating lens means is a condenser lens.

9. The lighting system, according to claim 1, wherein: said collimating lens means is a Fresnel lens.

10. The lighting system, according to claim 1, wherein:
said fixture means is a light pipe composed of a top wall and two opposite side walls, all being one-way internally reflective mirrors, and a bottom wall being a two-way mirror.

11. The lighting system, according to claim 1, wherein:
said fixture means is a prism light guide.

12. The lighting system, according to claim 1, wherein:
said artificial light source means is a high pressure sodium vapor lamp.

13. The lighting system, according to claim 1, wherein:
said artificial light source means is a metal halide lamp.

14. The lighting system, according to claim 1, wherein:
said artificial light source means is a mercury vapor lamp.

15. The lighting system, according to claim 1, further comprising:
a conical feeder means, positioned between the optical conduit means and the lens means, for reflecting the light at the set angle into the lens means.

16. The lighting system, according to claim 1, wherein:
said reflecting means is a parabolic-type reflector.

* * * * *